United States Patent
Kim et al.

(10) Patent No.: US 12,520,477 B2
(45) Date of Patent: Jan. 6, 2026

(54) METHOD FOR FABRICATING THREE DIMENSIONAL MEMORY DEVICES

(71) Applicant: SK hynix Inc., Gyeonggi-do (KR)

(72) Inventors: Seung Hwan Kim, Gyeonggi-do (KR); Kang Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 417 days.

(21) Appl. No.: 18/324,152

(22) Filed: May 26, 2023

(65) Prior Publication Data

US 2024/0215216 A1    Jun. 27, 2024

(30) Foreign Application Priority Data

Dec. 23, 2022    (KR) .................. 10-2022-0183333

(51) Int. Cl.
*H10B 12/00*    (2023.01)

(52) U.S. Cl.
CPC ........... *H10B 12/03* (2023.02); *H10B 12/482* (2023.02); *H10B 12/488* (2023.02)

(58) Field of Classification Search
CPC ...... H10B 12/02; H10B 12/03; H10B 12/033; H10B 12/05; H10B 12/053; H10B 12/30; H10B 12/34; H10B 12/482; H10B 12/488
See application file for complete search history.

(56) References Cited

U.S. PATENT DOCUMENTS

| | | |
|---|---|---|
| 2022/0005810 A1 | 1/2022 | Kang et al. |
| 2022/0130831 A1 | 4/2022 | Lee et al. |
| 2022/0173106 A1 | 6/2022 | Choi et al. |
| 2024/0064956 A1* | 2/2024 | Karda .................. H10B 53/20 |

\* cited by examiner

*Primary Examiner* — Hoai V Pham
(74) *Attorney, Agent, or Firm* — IP & T GROUP LLP

(57) ABSTRACT

A method for fabricating a semiconductor device includes: forming a semiconductor layer pattern over a lower structure; forming a gate dielectric layer to cover surfaces of the semiconductor layer pattern; forming a conductive layer over the gate dielectric layer to surround the semiconductor layer pattern, the conductive layer including a first edge portion and a second edge portion that are facing each other; and forming a pair of horizontal conductive lines vertically overlapping the semiconductor pattern by horizontally recessing the first edge portion and the second edge portion of the conductive layer.

15 Claims, 14 Drawing Sheets

12,520,477 B2

METHOD FOR FABRICATING THREE DIMENSIONAL MEMORY DEVICES

CROSS-REFERENCE TO RELATED APPLICATIONS

The present application claims priority of Korean Patent Application No. 10-2022-0183333, filed on Dec. 23, 2022, which is incorporated herein by reference in its entirety.

BACKGROUND

1. Field

Embodiments of the present disclosure relate generally to semiconductor technology and, more particularly, to a semiconductor device including memory cells that are arranged in three dimensions, and a method for fabricating the same.

2. Description of the Related Art

To satisfy the recent demands for large capacity and miniaturization of memory devices, three-dimensional (3-D) memory devices including memory cells that are arranged in three dimensions have been suggested.

SUMMARY

Embodiments of the present disclosure are directed to a 3-D semiconductor device (hereinafter referred to simply as semiconductor device) including highly integrated memory cells, and a method for fabricating the semiconductor device.

In accordance with an embodiment of the present disclosure, a method for fabricating a semiconductor device includes: forming a semiconductor layer pattern over a lower structure; forming a gate dielectric layer to cover surfaces of the semiconductor layer pattern; forming a conductive layer over the gate dielectric layer to surround the semiconductor layer pattern, the conductive layer including a first edge portion and a second edge portion that are facing each other; and forming a pair of horizontal conductive lines vertically overlapping the semiconductor pattern by horizontally recessing the first edge portion and the second edge portion of the conductive layer.

In accordance with another embodiment of the present disclosure, a semiconductor device includes: a bit line vertically oriented from a lower structure; a semiconductor layer pattern horizontally oriented from the bit line; a gate dielectric layer fully covering upper and lower surfaces of the semiconductor layer pattern; and a word line horizontally oriented over the gate dielectric layer along a direction crossing the semiconductor layer pattern. The semiconductor device further includes: a data storage element which is coupled to the semiconductor layer pattern, wherein each of the upper and lower surfaces of the semiconductor layer pattern has a flat surface, and first sides of the gate dielectric layers contact the bit line, and second sides of the gate dielectric layers contact the data storage element.

In accordance with another embodiment of the present disclosure, a semiconductor device includes: a horizontal layer spaced apart from a lower structure and extending in a direction parallel to the lower structure; a vertical conductive line extending in a direction perpendicular to the lower structure and coupled to a first side end of the horizontal layer; a data storage element coupled to a second side end of the horizontal layer; and a horizontal conductive line extending in a direction crossing the horizontal layer, wherein the horizontal conductive line includes: a first work function electrode; a second work function electrode disposed adjacent to the vertical conductive line and having a lower work function than the first work function electrode; a third work function electrode disposed adjacent to the data storage element and having a lower work function than the first work function electrode; a first barrier layer disposed between the first work function electrode and the third work function electrode; and a second barrier layer disposed between the first work function electrode and the second work function electrode.

In accordance with another embodiment of the present disclosure, a semiconductor device includes: a semiconductor layer spaced apart from a lower structure and extending in a direction parallel to the lower structure; a vertical conductive line extending in a direction perpendicular to the substrate and coupled to a first side end of the semiconductor layer; a data storage element coupled to a second side end of the semiconductor layer; and a word line extending in a direction crossing the semiconductor layer, wherein the word line includes a metal electrode; a first polysilicon electrode disposed adjacent to the vertical conductive line and having a lower work function than the metal electrode; and a second polysilicon electrode disposed adjacent to the data storage element and having a lower work function than the metal electrode.

In accordance with another embodiment of the present disclosure, a semiconductor device includes: a lower structure; a three-dimensional array including a column array of transistors vertically stacked over the lower structure; a vertical conductive line oriented vertically over the lower structure and commonly coupled to a first side of each of the transistors of the three-dimensional array; and data storage elements coupled to second sides of the transistors of the three-dimensional array, wherein the transistors of each of the column arrays of the three-dimensional array includes: a horizontal layer; and a horizontal conductive line having a triple work function electrode structure extending horizontally in a direction crossing the horizontal layer. The horizontal conductive line of the triple work function electrode structure may include a first low work function electrode, a second low work function electrode, and a high work function electrode between the first low work function electrode and the second low work function electrode.

DETAILED DESCRIPTION

Figure 1A:
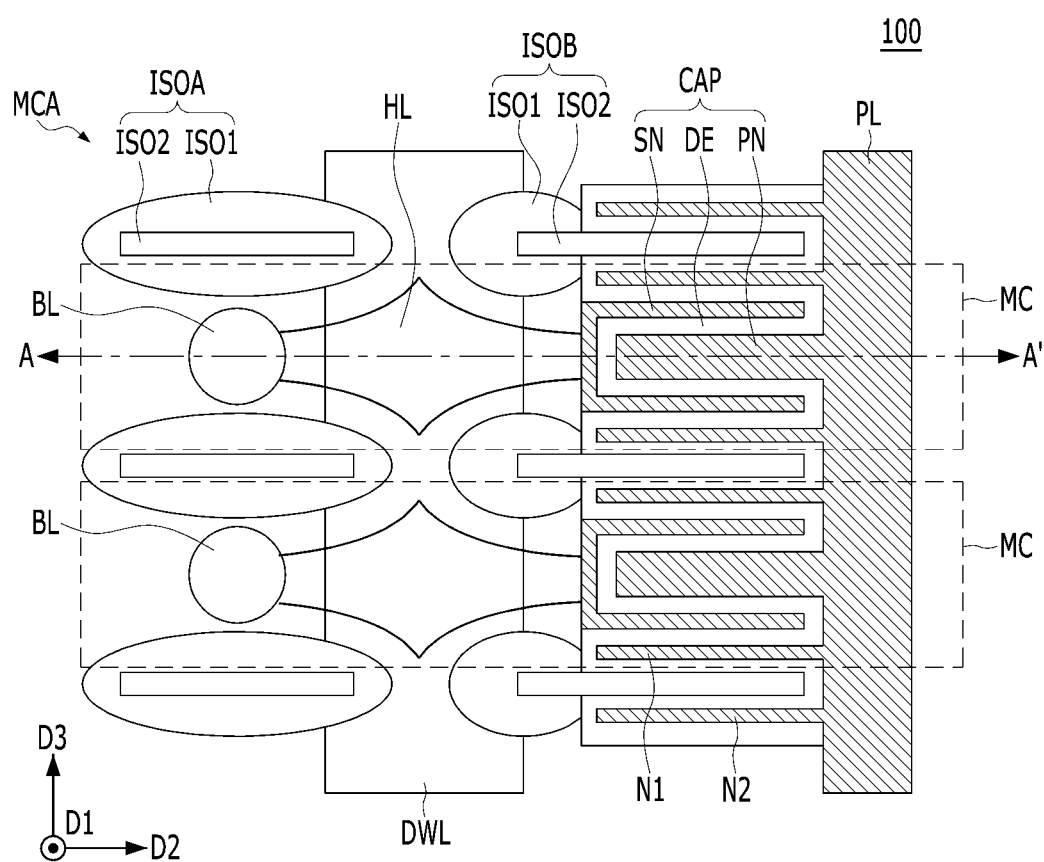
FIG. 1A is a plan view illustrating a semiconductor device in accordance with an embodiment of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly over the second layer or the substrate but also a case where a third layer exists between the first layer and the second layer or the substrate.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names.

According to the following embodiments described below, memory cells may be vertically stacked to increase memory cell density and reduce parasitic capacitance.

The following embodiments of the present disclosure described below relate to three-dimensional memory cells, and a horizontal conductive line (word line or gate electrode) may include a low work function electrode and a high work function electrode. The low work function electrode may be disposed adjacent to a data storage element (e.g., a capacitor) and a vertical conductive line (or a bit line), and the high work function electrode may overlap with a channel of the horizontal layer.

Due to the low work function of the low work function electrode, a low electric field may be formed between the horizontal conductive line and the data storage element, thereby improving leakage current.

With the high work function of the high work function electrode, a high threshold voltage of a switching element may be formed, and the low electric field may reduce the height of the memory cells, which is advantageous in terms of integration.

Figure 1B:
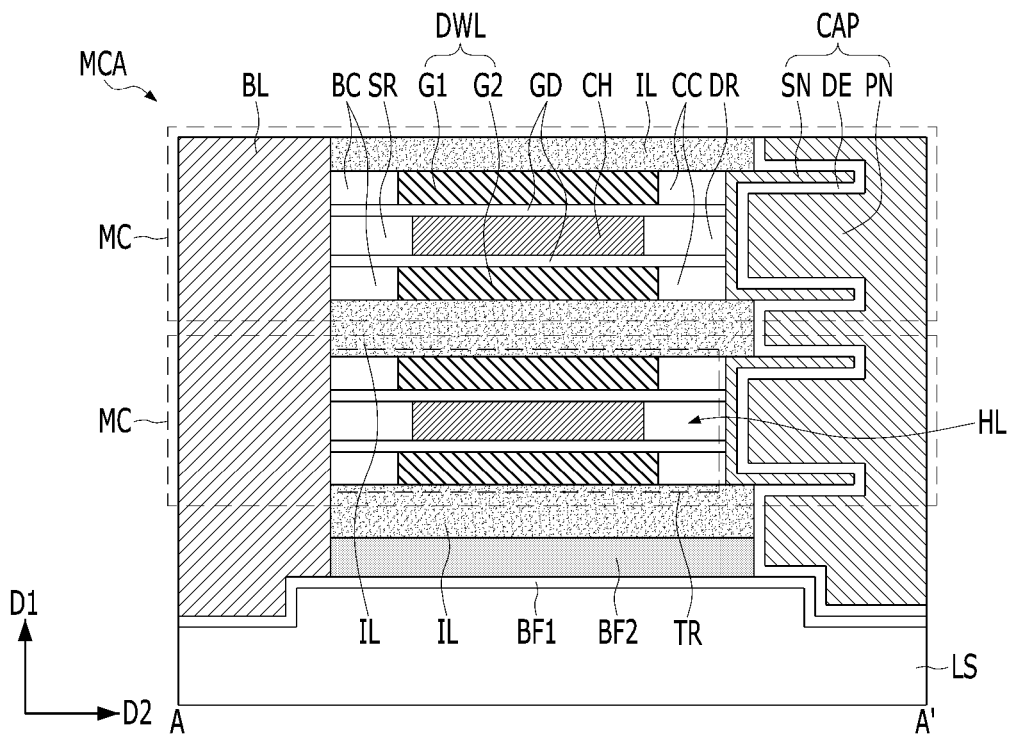
FIG. 1B is a cross-sectional view taken along a line A-A' shown in FIG. 1A.

FIG. 1A is a plan view illustrating a semiconductor device 100 in accordance with an embodiment of the present disclosure. FIG. 1B is a cross-sectional view taken along a line A-A' shown in FIG. 1A.

Referring to FIGS. 1A and 1B, the semiconductor device 100 may include a memory cell array MCA. The memory cell array MCA may include a plurality of memory cells MC. The memory cell array MCA may include a three-dimensional (3D) array of memory cells MC. The 3D array of the memory cells MC may include a column array of memory cells MC and a row array of memory cells MC. The column array of memory cells MC may have a plurality of memory cells MC that are stacked in a first direction D1, and the row array of the memory cells MC may have a plurality of memory cells MC that are horizontally disposed in a second direction D2 and a third direction D3. According to some embodiments of the present disclosure, cell dielectric layers IL may be disposed between the memory cells MC that are stacked in the first direction D1. Isolation layers ISOA and ISOB may be disposed between the neighboring memory cells MC in the third direction D3. The isolation layers ISOA and ISOB may include a first isolation material ISO1 and a second isolation material ISO2. For example, the first isolation material ISO1 may include silicon oxide, and the second isolation material ISO2 may include silicon carbon oxide (SiCO).

The memory cell array MCA may be disposed over the lower structure LS.

Each memory cell MC may include a vertical conductive line BL, a switching element TR, and a data storage element CAP. The switching element TR may include a horizontal layer HL, a gate dielectric layer GD, and a horizontal conductive line DWL. The data storage element CAP may include a memory element, such as a capacitor. The vertical conductive line BL may include a bit line. The horizontal conductive line DWL may include a word line, and the horizontal layer HL may include an active layer. The data storage element CAP may include a first electrode SN, a dielectric layer DE, and a second electrode PN. The switching element TR may include a transistor, and in this case, the horizontal conductive line DWL may serve as a gate electrode. The switching element TR may also be referred to as an access element or a selection element.

The memory cell array MCA may include a plurality of horizontal conductive lines DWL that are vertically stacked in the first direction D1. The memory cell array MCA may include a plurality of horizontal layers HL that are vertically stacked in the first direction D1. The memory cell array MCA may include a plurality of data storage elements CAP that are vertically stacked in the first direction D1.

A plurality of buffer layers BF1 and BF2 may be disposed between the lowermost horizontal conductive line DWL among the horizontal conductive lines DWL and the lower structure LS. The buffer layers BF1 and BF2 may include a dielectric material. The buffer layers BF1 and BF2 may include a first buffer layer BF1 and a second buffer layer BF2. The first and second buffer layers BF1 and BF2 may include, for example, silicon oxide. The buffer layers BF1 and BF2 may cover the entire surface of the lower structure LS, and thus, the vertical conductive line BL and the data storage elements CAP may be electrically separated from the lower structure LS.

The vertical conductive line BL may extend vertically over the lower structure LS in the first direction D1. The horizontal layer HL may extend in a second direction D2 crossing the first direction D1. The horizontal conductive line DWL may extend in a third direction D3 crossing the first and second directions D1 and D2.

The vertical conductive line BL may be vertically oriented in the first direction D1. The vertical conductive line BL may be referred to as a vertically-oriented bit line, a vertically-extended bit line, or a pillar-shaped bit line. The vertical conductive line BL may include a conductive material. The vertical conductive line BL may include a silicon-based material, a metal-based material, or a combination thereof. For example, the vertical conductive line BL may include polysilicon, a metal, a metal nitride, a metal silicide, or a combination thereof. The vertical conductive line BL may include polysilicon, titanium nitride, tungsten, or a combination thereof. For example, the vertical conductive line BL may include polysilicon or titanium nitride (TiN) that is doped with an N-type impurity. The vertical conductive line BL may include a stack (TiN/W) of titanium nitride and tungsten.

The switching element TR may include a transistor, and thus, the horizontal conductive line DWL may be referred to as a horizontal gate line or a horizontal word line.

The horizontal conductive line DWL may extend in the third direction D3, and the horizontal layer HL may extend in the second direction D2. The horizontal layer HL may be horizontally arranged from the vertical conductive line BL. The horizontal conductive line DWL may have a double structure. For example, the horizontal conductive line DWL may include first and second horizontal conductive lines WL1 and WL2 facing each other with the horizontal layer HL interposed therebetween. A gate dielectric layer GD may be formed on the upper and lower surfaces of the horizontal layer HL. A first horizontal conductive line WL1 may be disposed over the horizontal layer HL, and a second horizontal conductive line WL2 may be disposed below the horizontal layer HL. The horizontal conductive line DWL may include a pair of a first horizontal conductive line WL1 and a second horizontal conductive line WL2. In the horizontal conductive line DWL, the first horizontal conductive line WL1 and the second horizontal conductive line WL2 may have the same potential. For example, the first horizontal conductive line WL1 and the second horizontal conductive line WL2 may form a pair to be coupled to one memory cell MC. The same driving voltage may be applied to the first horizontal conductive line WL1 and the second horizontal conductive line WL2.

The horizontal layer HL may extend in the second direction D2. In an embodiment, the second direction may be a direction parallel to a top surface of the lower structure LS. The horizontal layer HL may include a semiconductor material. For example, the horizontal layer HL may include polysilicon, monocrystalline silicon, germanium, or silicon-germanium. According to another embodiment of the present disclosure, the horizontal layer HL may include an oxide semiconductor material. For example, the oxide semiconductor material may include indium gallium zinc oxide (IGZO).

The upper and lower surfaces of the horizontal layer HL may have flat surfaces. In other words, the upper and lower surfaces of the horizontal layer HL may be parallel to each other in the second direction D2.

The horizontal layer HL may include a channel CH, a first doped region SR disposed between the channel CH and the vertical conductive line BL, and a second doped region DR disposed between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with impurities of the same conductivity type. The first doped region SR and the second doped region DR may be doped with N-type impurities or P-type impurities. The first doped region SR and the second doped region DR may include at least one impurity selected among arsenic (As), phosphorus (P), boron (B), indium (In), and combinations thereof. The first doped region SR may be coupled to the vertical conductive line BL, and the second doped region DR may be coupled to a first electrode SN of the data storage element CAP. The first and second doped regions SR and DR may be referred to as first and second source/drain regions.

The gate dielectric layer GD may include, for example, silicon oxide, silicon nitride, a metal oxide, a metal oxynitride, a metal silicate, a high-k material, or a ferroelectric material, an anti-ferroelectric material, or a combination thereof. The gate dielectric layer GD may include, for example, $SiO_2$, $Si_3N_4$, $HfO_2$, $Al_2O_3$, $ZrO_2$, AlON, HfON, HfSiO, HfSiON, or a combination thereof.

The gate dielectric layer GD may have a shape that fully covers a first surface (or an upper surface) and a second surface (or a lower surface) of the horizontal layer HL, respectively. The length of the gate dielectric layer GD in the second direction D2 may be the same as the length of the horizontal layer HL. The first and second surfaces of the horizontal layer HL may be flat surfaces. First sides of the gate dielectric layers GD may contact the vertical conductive line BL, and second sides of the gate dielectric layers GD may contact the first electrode SN of the data storage element CAP.

The horizontal conductive line DWL may include a metal, a metal mixture, a metal alloy, or a semiconductor material. The horizontal conductive line DWL may include titanium nitride, tungsten, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or more.

The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may have a horizontally oriented cylindrical-shape. The dielectric layer DE may conformally cover the inner wall and the outer wall of the cylinder of the first electrode SN. The second electrode PN may cover the cylindrical inner wall and the cylindrical outer wall of the first electrode SN over the dielectric layer DE. The first electrode SN may be electrically connected to the second doped region DR. The second electrode PN may include a plurality of outer nodes N1 and N2 that are disposed on the outer wall of the first electrode SN. The outer nodes N1 and N2 of the memory cells MC that are disposed adjacent to each other in the third direction D3 may be separated from each other by the second isolation materials ISO2 of the isolation layer ISOB.

The first electrode SN has a 3D structure, and the first electrode SN of the 3D structure may have a horizontal 3D structure which is oriented in the second direction D2. As an example of the 3D structure, the first electrode SN may have a cylindrical shape. According to another embodiment of the present disclosure, the first electrode SN may have a pillar shape or a pylinder shape. The pylinder shape may refer to a structure in which a pillar shape and a cylindrical shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the first electrode SN, and titanium nitride (TiN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or greater. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present disclosure, the dielectric layer DE may be formed of a composite layer including two or more layers of the aforementioned high-k material.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present disclosure, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present disclosure, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present disclosure, the dielectric layer DE may include a stack structure, a laminated structure, or a mixed structure including zirconium oxide, hafnium oxide, and aluminum oxide.

According to another embodiment of the present disclosure, an interface control layer for improving leakage current may be further formed between the first electrode SN and the dielectric layer DE. The interface control layer may include titanium oxide ($TiO_2$), tantalum oxide ($Ta_2O_5$), or niobium oxide ($Nb_2O_5$). The interface control layer may also be formed between the second electrode PN and the dielectric layer DE.

The data storage element CAP may include a Metal-Insulator-Metal (MIM) capacitor. The first electrode SN and the second electrode PN may include a metal-based material.

The data storage element CAP may be replaced with other data storage materials. For example, the data storage material may be a phase change material, a magnetic tunnel junction (MTJ), or a variable resistance material.

A first capping layer BC may be disposed between the horizontal conductive line DWL and the vertical conductive line BL. A second capping layer CC may be disposed between the horizontal conductive line DWL and the first electrode SN of the data storage element. The first capping layer BC may be disposed between the first horizontal conductive line WL1 and the vertical conductive line BL, and also, the first capping layer BC may be disposed between the second horizontal conductive line WL2 and the vertical conductive lines BL. The second capping layer CC may be disposed between the first horizontal conductive line WL1 and the first electrode SN of the data storage element CAP, and also, the second capping layer CC may be disposed between the second horizontal conductive line WL2 and the first electrode SN of the data storage element CAP.

The first and second capping layers BC and CC may include a dielectric material. The first and second capping layers BC and CC may include silicon oxide, silicon nitride, silicon carbon oxide, an air gap, or a combination thereof. The first capping layer BC may include silicon oxide, and the second capping layer CC may include a stack of silicon oxide and silicon nitride.

Figure 2:
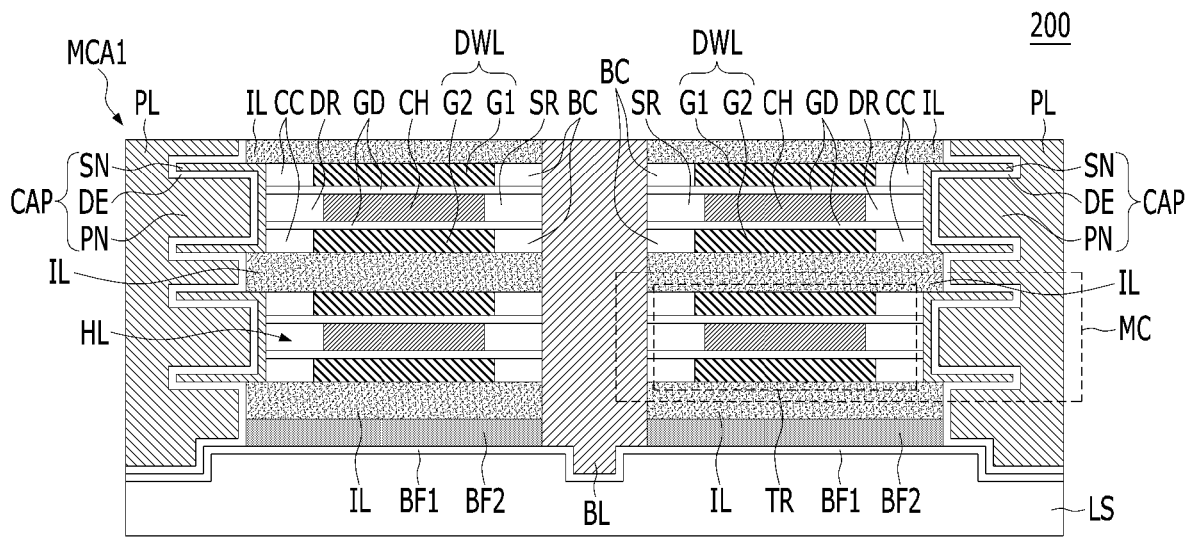
FIG. 2 is a cross-sectional view illustrating a semiconductor device in accordance with another embodiment of the present disclosure.

FIG. 2 is a cross-sectional view illustrating a semiconductor device 200 in accordance with another embodiment of the present disclosure. Hereinafter, as for the detailed description on the constituent elements of FIG. 2 also appearing in FIGS. 1A and 1B, description of FIGS. 1A and 1B may be refer to.

Referring to FIG. 2, the semiconductor device 200 may include a lower structure LS and a memory cell array MCA1. The memory cell array MCA1 may include a 3D array of memory cells MC. The 3D array of the memory cells MC may include a column array of memory cells MC and a row array of memory cells MC. The column array of the memory cells MC may include a plurality of memory cells MC that are stacked in the first direction D1, and the row array of the memory cells MC may include a plurality of memory cells MC that are horizontally disposed in the third direction D3. Cell dielectric layers IL may be disposed between the memory cells MC that are stacked in the first direction D1. First and second buffer layers BF1 and BF2 may be disposed between the memory cell array MCA1 and the lower structure LS. The second buffer layer BF2 may cover the entire surface of the lower structure LS, and thus the vertical conductive line BL and the data storage elements CAP may be electrically separated from the lower structure LS.

The memory cell array MCA1 may have a mirror-type structure where a vertical conductive line BL is shared.

Each memory cell MC may include a vertical conductive line BL, a switching element TR, and a data storage element CAP. Each switching element TR may be a transistor and may include a horizontal layer HL, a gate dielectric layer GD, and a horizontal conductive line DWL. Each horizontal layer HL may include a first doped region SR, a second doped region DR, and a channel CH between the first doped region SR and the second doped region DR. Each horizontal conductive line DWL may include a pair of a first horizontal conductive line G1 and a second horizontal conductive line G2. Each data storage element CAP may include a first electrode SN, a second electrode PN, and a dielectric layer DE between the first electrode SN and the second electrode PN. A first capping layer BC may be disposed between the horizontal conductive line DWL and the vertical conductive line BL. A second capping layer CC may be disposed between the horizontal conductive line DWL and the first electrode SN of the data storage element CAP.

The column array of the memory cells MC may include a plurality of switching elements TR that are stacked in the first direction D1, and the row array of the memory cells MC may include a plurality of switching elements TR that are disposed horizontally in the third direction D3.

The horizontal layers HL may be stacked over the lower structure LS in the first direction D1, and the horizontal layers HL may be spaced apart from the lower structure LS to extend in the second direction D2, which is parallel to the surface of the lower structure LS.

The vertical conductive line BL may extend in the first direction D1, which is perpendicular to the surface of the lower structure LS, and may be coupled to first side ends of the horizontal layers HL.

The data storage elements CAP may be coupled to second side ends of the horizontal layers HL, respectively.

The horizontal conductive lines DWL may be stacked over the lower structure LS in the first direction D1, and the horizontal conductive lines DWL may be spaced apart from the lower structure LS to extend in the third direction D1, which is parallel to the surface of the lower structure LS.

The second electrodes PN of the data storage elements CAP may be coupled to a common plate PL. The horizontal layers HL of the switching elements TR that are disposed horizontally in the third direction D3 may share one horizontal conductive line DWL. The horizontal layers HL of the switching elements TR that are disposed horizontally in the third direction D3 may be coupled to different vertical conductive lines BL. The switching elements TR stacked in the first direction D1 may share one vertical conductive line BL. The switching elements TR disposed horizontally in the third direction D3 may share one horizontal conductive line DWL.

The lower structure LS may include a semiconductor substrate or a peripheral circuit unit. The lower structure LS may be disposed at a lower level than the memory cell array MCA. This may be referred to as a COP (Cell-Over-Peripheral) structure. The peripheral circuit unit may include at least one control circuit for driving the memory cell array MCA. The at least one control circuit of the peripheral circuit unit may include an N-channel transistor, a P-channel transistor, a CMOS circuit, or a combination thereof. The at least one control circuit of the peripheral circuit unit may include an address decoder circuit, a read circuit, a write circuit, and the like. The at least one control circuit of the peripheral circuit unit may include a planar channel transistor, a recess channel transistor, a buried gate transistor, a fin channel transistor (FinFET), and the like.

For example, the peripheral circuit unit may include sub-word line drivers and a sense amplifier. The horizontal conductive lines DWL may be coupled to the sub-word line drivers. The vertical conductive line BL may be coupled to the sense amplifier.

According to another embodiment of the present disclosure, the peripheral circuit unit may be disposed at a higher level than the memory cell array MCA. This may be referred to as a POC (Peripheral-Over-Cell) structure.

The memory cell array MCA may include horizontal conductive lines DWL that are stacked in the first direction D1. Each of the horizontal conductive lines DWL may include a pair of a first horizontal conductive line G1 and a second horizontal conductive line G2.

According to another embodiment of the present disclosure, the semiconductor device 200 may include a mirror-type structure sharing a common plate PL.

The memory cell array MCA illustrates a three-dimensional memory cell array including four memory cells MC.

According to another embodiment of the present disclosure, the peripheral circuit unit may be disposed at a higher level than the memory cell array MCA1. This may be referred to as a POC (Peripheral-Over-Cell) structure.

Figure 3A:
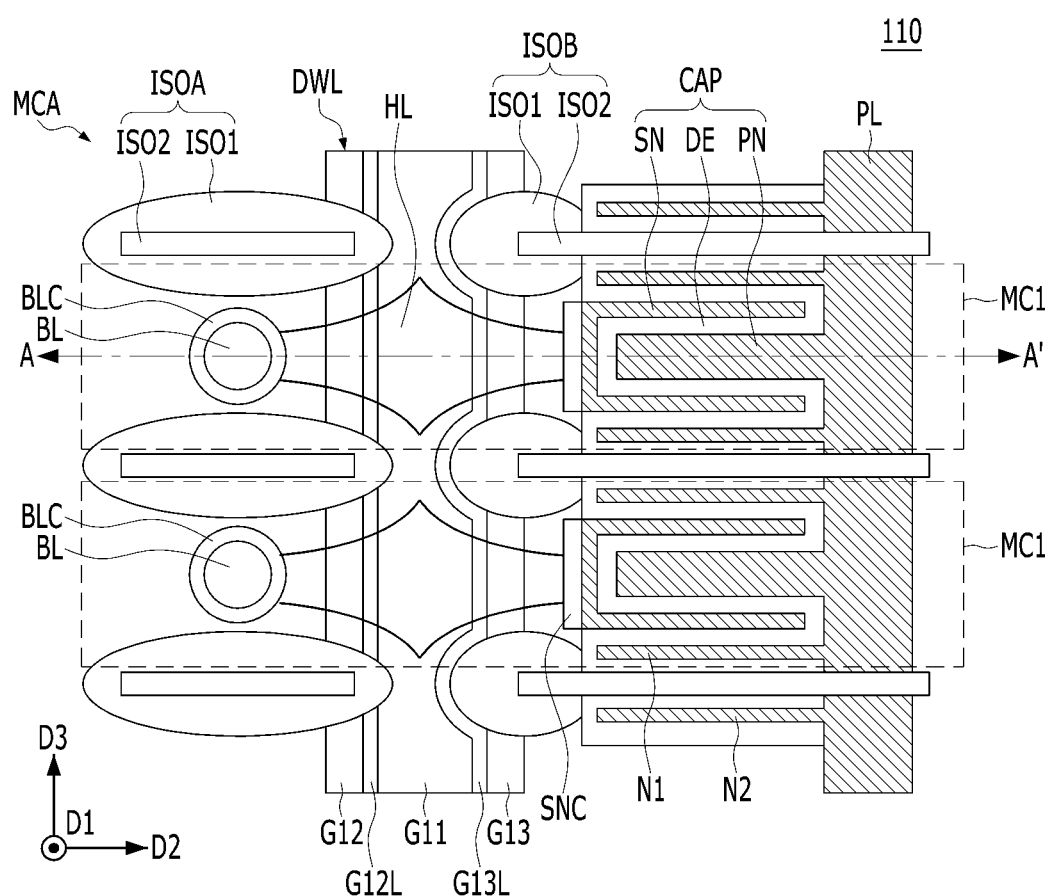
FIG. 3A is a plan view illustrating a semiconductor device in accordance with another embodiment of the present disclosure.
Figure 3B:
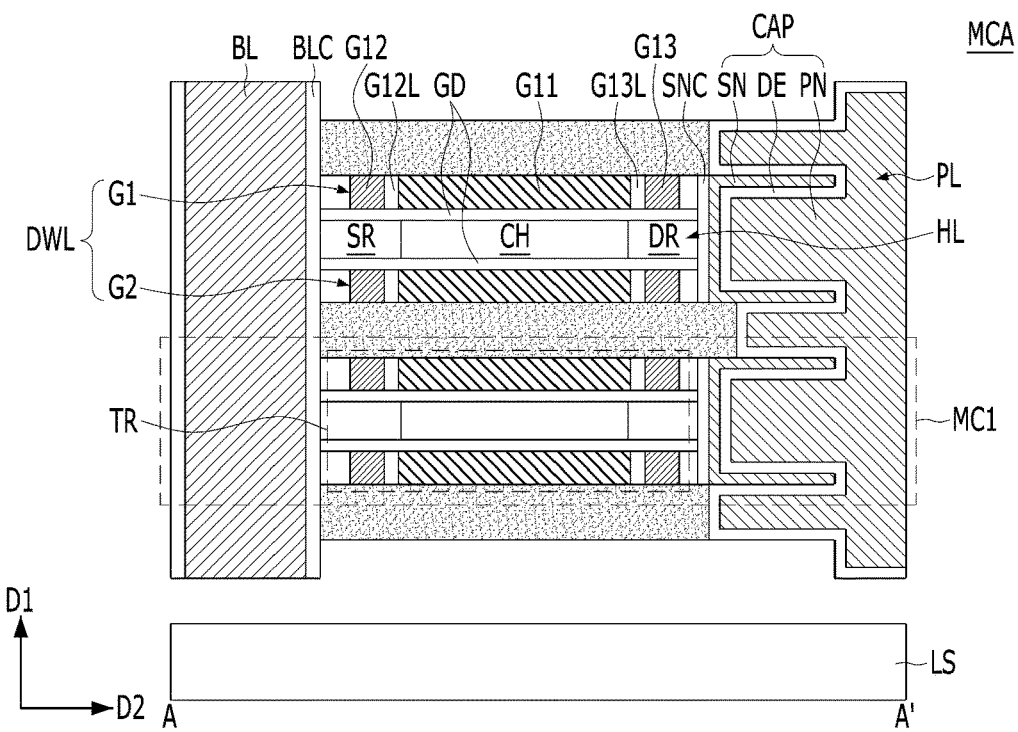
FIG. 3B is a cross-sectional view illustrating a memory cell array shown in FIG. 3A.

FIG. 3A is a plan view illustrating a semiconductor device 110 in accordance with another embodiment of the present disclosure. FIG. 3B is a cross-sectional view illustrating a memory cell array shown in FIG. 3A. Hereinafter, as for the detailed description on the constituent elements of FIG. 3A also appearing in FIGS. 1A to 2, the description of FIGS. 1A to 2 may be referred to.

Referring to FIGS. 3A and 3B, the semiconductor device 110 may include a lower structure LS and a memory cell array MCA. The memory cell array MCA may include a plurality of memory cells MC1. Each memory cell MC1 may include a vertical conductive line BL, a switching element TR, and a data storage element CAP. The switching element TR may include a horizontal layer HL, a gate dielectric layer GD, and a horizontal conductive line DWL. The horizontal layer HL may include a first doped region SR, a second doped region DR, and a channel CH. The data storage element CAP may include a first electrode SN, a second electrode PN, and a dielectric layer DE. First and second buffer layers may be disposed between the memory cell array MCA and the lower structure LS. The first and second buffer layers refer to the first and second buffer layers BF1 and BF2 of FIGS. 1A to 2.

The memory cell MC1 may further include a first contact node BLC between the vertical conductive line BL and the horizontal layer HL and a second contact node SNC between the horizontal layer HL and the data storage element CAP. The first and second contact nodes BLC and SNC may include doped polysilicon. The first doped region SR and the second doped region DR may include impurities that are diffused from the first contact node BLC and the second contact nodes SNC, respectively. The first contact node BLC may surround the vertical conductive line BL.

Cell dielectric layers IL may be disposed between the memory cells MC1 that are stacked in the first direction D1. Isolation layers ISOA and ISOB may be disposed between the neighboring memory cells MC1 in the third direction D3. The isolation layers ISOA and ISOB may include a first isolation material ISO1 and a second isolation material ISO2. The first isolation material ISO1 may include silicon oxide, and the second isolation material ISO2 may include silicon carbon oxide (SiCO).

The second electrodes PN of the data storage elements CAP of the memory cells MC1 that are adjacent to each other in the third direction D3 may be separated from each other. For example, second electrodes PN neighboring in the third direction D3 may be separated from each other by the second isolation material ISO2. The second electrodes PN of the memory cells MC1 that are adjacent to each other in the third direction D3 may be completely separated by the second isolation material ISO2. The common plates PL neighboring in the third direction D3 may be completely separated by the second isolation material ISO2.

The horizontal conductive line DWL may include a first horizontal conductive line G1 and a second horizontal conductive line G2. Each of the first and second horizontal conductive lines G1 and G2 may include a first work function electrode G11, a second work function electrode G12, and a third work function electrode G13. The first work function electrode G11, the second work function electrode G12, and the third work function electrode G13 may be horizontally disposed in the second direction D2. The first work function electrode G11, the second work function electrode G12, and the third work function electrode G13 may be in parallel with each other while directly contacting each other. The second work function electrode G12 may be disposed adjacent to the vertical conductive line BL, and the third work function electrode G13 may be disposed adjacent to the data storage element CAP. The horizontal layer HL may have a thickness that is smaller than the thicknesses of the first, second, and third work function electrodes G11, G12, and G13. The first work function electrode G11, the second work function electrode G12, and the third work function electrode G13 may be referred to as a first gate, a second gate, and a third gate, respectively.

The first work function electrode G11, the second work function electrode G12, and the third work function electrode G13 may be formed of materials having different work functions. The first work function electrode G11 may have a higher work function than the second and third work function electrodes G12 and G13. The first work function electrode G11 may include a high work function material. The first work function electrode G11 may have a work function which is higher than a mid-gap work function of silicon. The second and third work function electrodes G12 and G13 may include a low work function material. The second and third work function electrodes G12 and G13 may have a work function which is lower than the mid-gap work function of silicon. In other words, the high work function material may have a work function which is higher than approximately 4.5 eV, and the low work function material may have a work function which is lower than approximately 4.5 eV. The first work function electrode G11 may include a metal-based material, and the second and third work function electrodes G12 and G13 may include a semiconductor material.

The second and third work function electrodes G12 and G13 may include N-type dopant-doped polysilicon. The first work function electrode G11 may include a metal, a metal nitride, or a combination thereof. The first work function electrode G11 may include tungsten, titanium nitride, or a combination thereof. A barrier material may be further formed between the second and third work function electrodes G12 and G13 and the first work function electrode G11.

According to this embodiment of the present disclosure, the first and second horizontal conductive lines G1 and G2 of the horizontal conductive line DWL may be horizontally disposed in the order of the second work function electrode G12—the first work function electrode G11—the third work function electrode G13 in the second direction D2. The first work function electrode G11 may include a metal, and the second work function electrode G12 and the third work function electrode G13 may include polysilicon.

Each of the first and second horizontal conductive lines G1 and G2 of the horizontal conductive line DWL may have a PMP (Polysilicon-Metal-Polysilicon) structure in which polysilicon-metal-polysilicon are horizontally disposed in the second direction D2. In the PMP structure, the first work function electrode G11 may be a metal-based material, and the second and third work function electrodes G12 and G13 may be doped with N-type dopant-doped polysilicon. The N-type dopant may include phosphorus or arsenic.

A first barrier layer G12L may be disposed between the first work function electrode G11 and the second work function electrode G12. A second barrier layer G13L may be disposed between the first work function electrode G11 and the third work function electrode G13. The first and second barrier layers G12L and G13L may include titanium nitride, tantalum nitride, tungsten nitride, or molybdenum nitride.

A plurality of first barrier layers G12L may be disposed on a first side of the first work function electrode G11 in the third direction D3, and the first barrier layers G12L may be discontinuous by the isolation layer ISOA in the direction D3. A plurality of second work function electrodes G12 may be disposed in the third direction D3, and the second work function electrodes G12 may be discontinuous in the third direction D3 due to the isolation layer ISOA.

One continuous second barrier layer G13L may be disposed on a second side of the first work function electrode G11 in the third direction D3, and the second barrier layer G13L may continue while covering the first side of the isolation layer ISOB in the three directions D3. A plurality of third work function electrodes G13 may be disposed in the third direction D3, and the third work function electrodes G13 may be discontinuous due to the isolation layer ISOB in the third direction D3.

The first work function electrode G11 may have a larger volume than the second and third work function electrodes G12 and G13, and accordingly, the horizontal conductive line DWL may have a low resistance. The first work function electrodes G11 of the first and second horizontal conductive lines G1 and G2 may vertically overlap with each other in the first direction D1 with the horizontal layer HL interposed therebetween. The second and third work function electrodes G12 and G13 of the first and second horizontal conductive lines G1 and G2 may vertically overlap with each other in the first direction D1 with the horizontal layer HL interposed therebetween. The overlapping area between the first work function electrode G11 and the horizontal layer HL may be greater than the overlapping area between the second and third work function electrodes G12 and G13 and the horizontal layer HL. The second and third work function electrodes G12 and G13 and the first work function electrode G11 may extend in the third direction D3.

As described above, each of the first and second horizontal conductive lines G1 and G2 may have a triple electrode structure including the first, second and third work function electrodes G11, G12 and G13. The horizontal conductive line DWL may include a pair of first work function electrodes G11, a pair of second work function electrodes G12, and a pair of third work function electrodes G13 extending in the third direction D3 crossing the horizontal layer HL with the horizontal layer HL interposed therebetween. The first work function electrodes G11 of the horizontal conductive line DWL may vertically overlap with the channel CH, and the second work function electrodes G12 of the horizontal conductive line DWL may overlap with the first doped region SR of the horizontal layer HL. The third work function electrodes G13 of the horizontal conductive line DWL may vertically overlap with the second doped region DR of the horizontal layer HL.

According to another embodiment of the present disclosure, the second work function electrodes G12 of the horizontal conductive line DWL may not overlap with the first doped region SR of the horizontal layer HL, and the third work function electrodes G13 of the horizontal conductive line DWL may not overlap with the second doped region DR of the horizontal layer HL. For example, the second and third work function electrodes G12 and G13 of the horizontal conductive line DWL may overlap with the channel CH, but may not overlap with the first and second doped regions SR and DR.

The first work function electrode G11 of a high work function may be disposed at the center of the horizontal conductive line DWL, and the second and third work function electrodes G12 and G13 of a low work function may be disposed at both ends of the horizontal conductive line DWL, thereby improving leakage current, such as gate induced drain leakage (GIDL).

As the first work function electrode G11 of a high work function is disposed at the center of the horizontal conductive line DWL, the threshold voltage of the switching element TR may be increased. Since the second work function electrode G12 of the horizontal conductive line DWL has a low work function, a low electric field may be formed between the vertical conductive line BL and the horizontal conductive line DWL. Since the third work function electrode G13 of the horizontal conductive line DWL has a low work function, a low electric field may be formed between the data storage element CAP and the horizontal conductive line DWL.

As described above, the memory cell MC1 may include the horizontal conductive line DWL having a triple work function electrode structure. Each of the first and second horizontal conductive lines G1 and G2 of the horizontal conductive line DWL may include the first work function electrode G11, the second work function electrode G12, and the third work function electrode G13. The first work function electrode G11 may overlap with the channel CH, and the second work function electrode G12 may be disposed adjacent to the vertical conductive line BL and the first doped region SR. The third work function electrode G13 may be disposed adjacent to the data storage element CAP and the second doped region DR. Due to the low work function of the second work function electrode G12, a low electric field may be formed between the horizontal conductive line DWL and the vertical conductive line BL, thereby improving leakage current. Due to the low work function of the third work function electrode G13, a low electric field may be formed between the horizontal conductive line DWL and the data storage element CAP, thereby improving leakage current. Due to the high work function of the first work function electrode G11, not only a high threshold voltage of the switching element TR may be formed, but also the height of the memory cell MC1 may be lowered due to the formation of a low electric field, which is advantageous in terms of integration.

As Comparative Example 1, when the first and second horizontal conductive lines G1 and G2 are formed of a metal-based material alone, due to a high work function of the metal-based material, a high electric field may be formed between the first and second horizontal conductive lines G1 and G2 and the data storage element CAP, which may deteriorate the leakage current of the memory cell MC1. The deterioration of the leakage current originating from the high electric field may be worse, as the channel CH becomes thinner.

As Comparative Example 2, when the first and second horizontal conductive lines G1 and G2 are formed of only a low work function material, the threshold voltage of the switching element TR may be reduced due to a low work function, thereby causing the leakage current.

According to the embodiment of the present disclosure, since each of the first and second horizontal conductive lines G1 and G2 of the horizontal conductive line DWL has a triple electrode structure, leakage current may be improved. Thus, it may be possible to secure refresh characteristics of the memory cell MC1 and reduce power consumption.

Also, according to the embodiment of the present disclosure, since each of the first and second horizontal conductive lines G1 and G2 of the horizontal conductive line DWL has a triple electrode structure, even though the thickness of the channel CH is reduced for high integration, it may be relatively advantageous to increasing the electric field. Thus, a high number of stacked layers may be realized.

FIGS. 4 to 24 are cross-sectional views illustrating an example of a method for fabricating a semiconductor device in accordance with an embodiment of the present disclosure.

Figure 4:
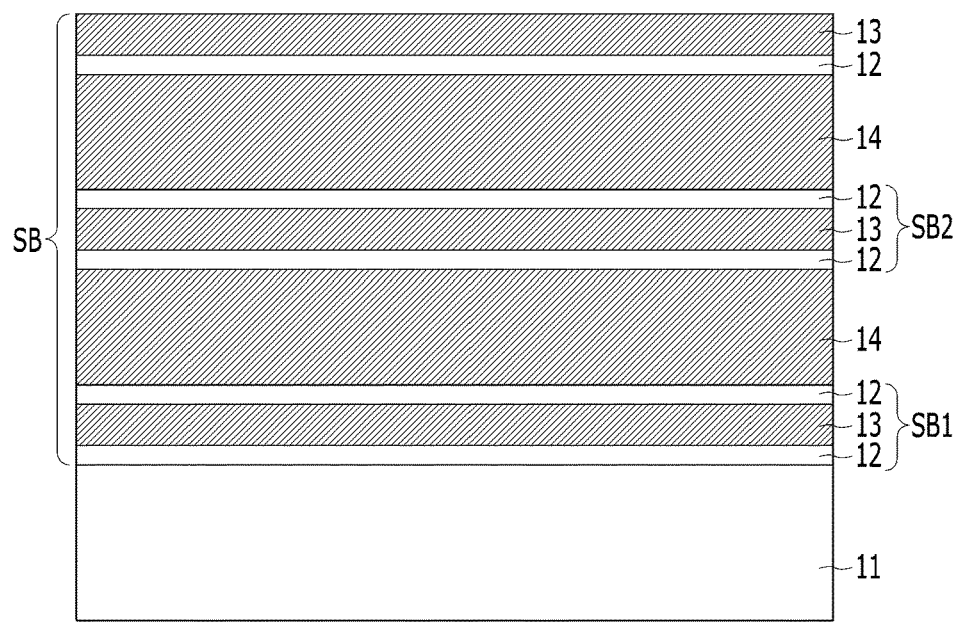
FIGS. 4 to 24 are cross-sectional views illustrating an example of a method for fabricating a semiconductor device in accordance with an embodiment of the present disclosure.

Referring to FIG. 4, a stack body SB may be formed over the lower structure 11. In the stack body SB, a plurality of sub-stacks may be alternately stacked. Each of the sub-stacks may include a sacrificial layer 12, a sacrificial semiconductor layer 13, a sacrificial layer 12, and a semiconductor layer 14 that are stacked in the mentioned order. The sacrificial layers 12 may include silicon germanium, and the sacrificial semiconductor layers 13 may include monocrystalline silicon. The semiconductor layer 14 may include monocrystalline silicon. The sacrificial layer 12, the sacrificial semiconductor layer 13, the sacrificial layer 12 and the semiconductor layer 14 may be formed by epitaxial growth. The sacrificial layer 12 may be thinner than the sacrificial semiconductor layer 13, and the semiconductor layer 14 may be thicker than the sacrificial semiconductor layer 13.

The stack body SB may include a first sacrificial layer structure SB1, a semiconductor layer 14, and a second sacrificial layer structure SB2. The first sacrificial layer structure SB1 may be disposed below the semiconductor layer 14, and the second sacrificial layer structure SB2 may be disposed over the semiconductor layer 14. Each of the first and second sacrificial layer structures SB1 and SB2 may be a triple layer stack of the sacrificial layer 12/the sacrificial semiconductor layer 13/the sacrificial layer 12. For example, when the sacrificial layer 12 includes a silicon germanium layer and the sacrificial semiconductor layer 13 includes a monocrystalline silicon layer, the triple layer stack of each of the first and second sacrificial layer structures SB1 and SB2 may include a first silicon germanium layer/monocrystalline silicon layer/second silicon germanium layer (SiGe/Si/SiGe) stack.

The sacrificial semiconductor layer 13 may include a first monocrystalline silicon layer, and the semiconductor layer 14 may include a second monocrystalline silicon layer. Accordingly, in the stack body SB, the first sacrificial layer structure SB1 may be disposed below the second monocrystalline silicon layer, and the second sacrificial layer structure SB2 may be disposed over the second monocrystalline silicon layer. Each of the first and second sacrificial layer structures SB1 and SB2 may include a first silicon germanium layer/first monocrystalline silicon layer/second silicon germanium layer stack. The second monocrystalline silicon layer may be thicker than the first monocrystalline silicon layer.

As described in the foregoing embodiments, when memory cells are stacked, the stack body SB may be stacked several times.

Figure 5:
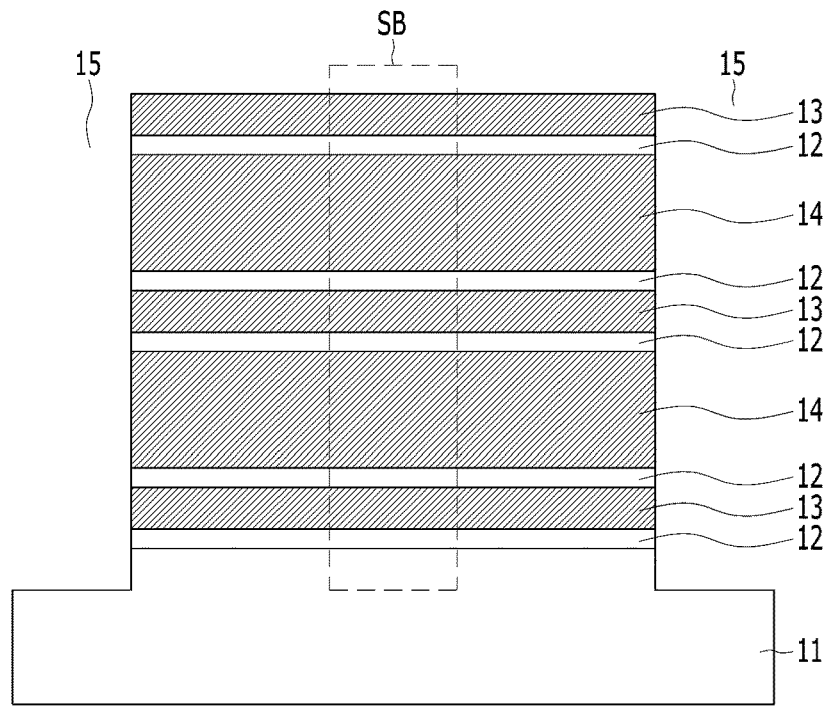

Referring to FIG. 5, first openings 15 may be formed by etching a portion of the stack body SB. The first openings 15 may extend vertically from the surface of the lower structure 11. Before the first openings 15 are formed, the stack body SB may be patterned on the basis of a memory cell unit.

Figure 6:
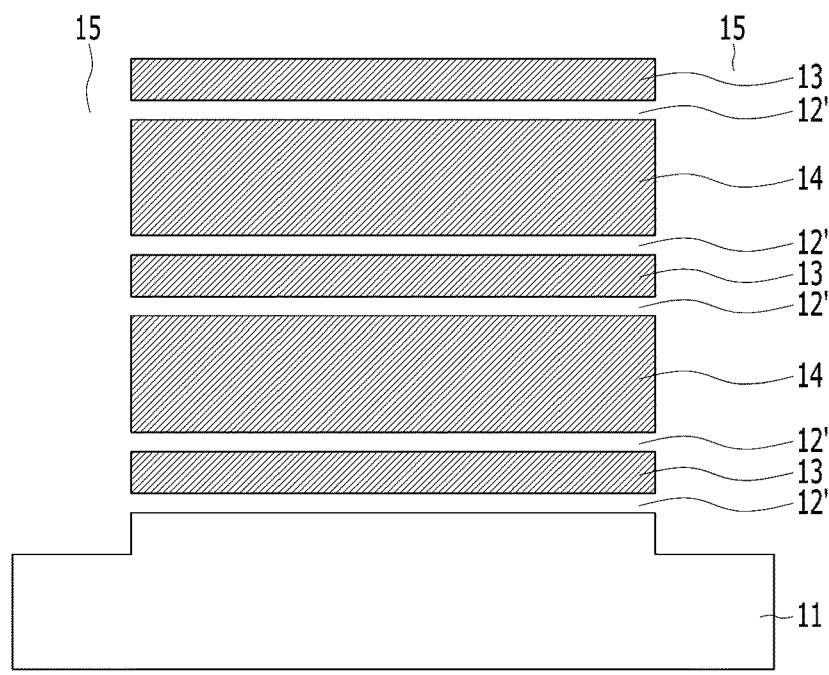

Referring to FIG. 6, a plurality of initial horizontal recesses 12' may be formed between the sacrificial semiconductor layers 13 and the semiconductor layers 14. In order to form a plurality of the initial horizontal recesses 12', the sacrificial layers 12 may be selectively removed through the first openings 15. The initial horizontal recesses 12' may have the same size, e.g., the same height.

In order to selectively remove the sacrificial layers 12, the difference in the etch selectivity between the sacrificial semiconductor layers 13, the semiconductor layers 14, and the sacrificial layers 12 may be used. The sacrificial layers 12 may be removed by wet etching or dry etching. For example, when the sacrificial layers 12 include a silicon germanium layer and the sacrificial semiconductor layers 13 and the semiconductor layers 14 include a silicon layer, the silicon germanium layers may be etched using an etchant or an etchant gas having a selectivity with respect to the silicon layers.

Figure 7:
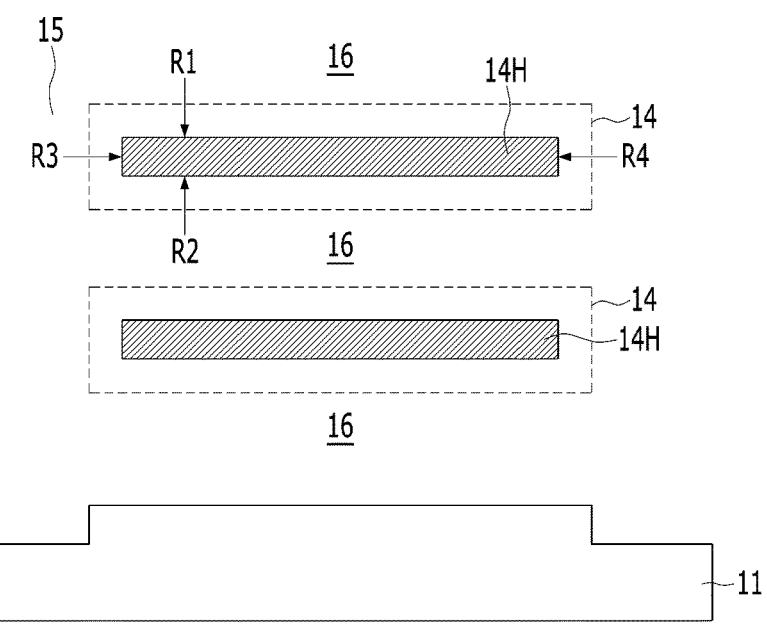

Referring to FIG. 7, the sacrificial semiconductor layers 13 and the semiconductor layers 14 may be recessed through the first openings 15 and the initial horizontal recesses 12' (see reference symbols R1, R2, R3, and R4). In order to recess the sacrificial semiconductor layers 13 and the semiconductor layers 14, wet etching or dry etching may be performed. According to the embodiment of the present disclosure, the semiconductor layers 14 may be partially etched until all of the sacrificial semiconductor layers 13 are removed. Accordingly, all of the thin sacrificial semiconductor layers 13 may be removed, and the thick semiconductor layers 14 may become thin as indicated by a reference numeral 14H. The recess process for forming the thin semiconductor layer 14H, that is, semiconductor layer patterns 14H, may be referred to as a thinning process of the semiconductor layers 14. The semiconductor layer patterns 14H may be referred to as a thin-body active layer. The semiconductor layer patterns 14H may, for example, include a monocrystalline silicon layer. While the semiconductor layer patterns 14H are formed, the surface of the lower structure 11 may be recessed to a predetermined depth.

Through the above-described recess process, the semiconductor layer patterns 14H and the horizontal recesses 16 may be formed. Each of the upper and lower surfaces of the semiconductor layer patterns 14H may be a flat surface.

Figure 8:
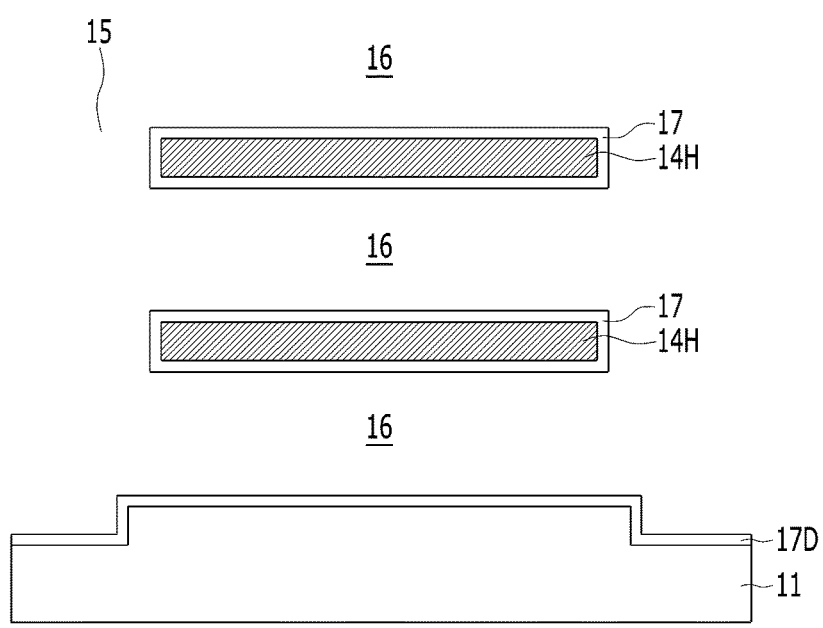

Referring to FIG. 8, a gate dielectric layer 17 fully covering the semiconductor layer patterns 14H may be formed. The gate dielectric layer 17 may be formed, for example, by a deposition process or an oxidation process. The gate dielectric layer 17 may include silicon oxide, silicon nitride, a metal oxide, a metal oxynitride, a metal silicate, a high-k material, a ferroelectric material, an anti-ferroelectric material or a combination thereof. The gate dielectric layer 17 may include $SiO_2$, $Si_3N_4$, $HfO_2$, $Al_2O_3$, $ZrO_2$, AlON, HfON, HfSiO, HfSiON, or combinations thereof. The gate dielectric layer 17 may be formed, for example, by a silicon oxide deposition process. The gate dielectric layer 17 may be formed, for example, by a surface oxidation process of the semiconductor layer patterns 14H.

According to an embodiment of the present disclosure, the gate dielectric layer 17 may be formed by an oxidation process. As a result, the gate dielectric layer 17 may be formed to have a uniform thickness on all the surfaces of the semiconductor layer patterns 14H.

While the gate dielectric layer 17 is formed, a first buffer layer 17D may be formed on the surface of the lower structure 11. The gate dielectric layer 17 and the first buffer layer 17D may be formed of the same material.

Figure 9:
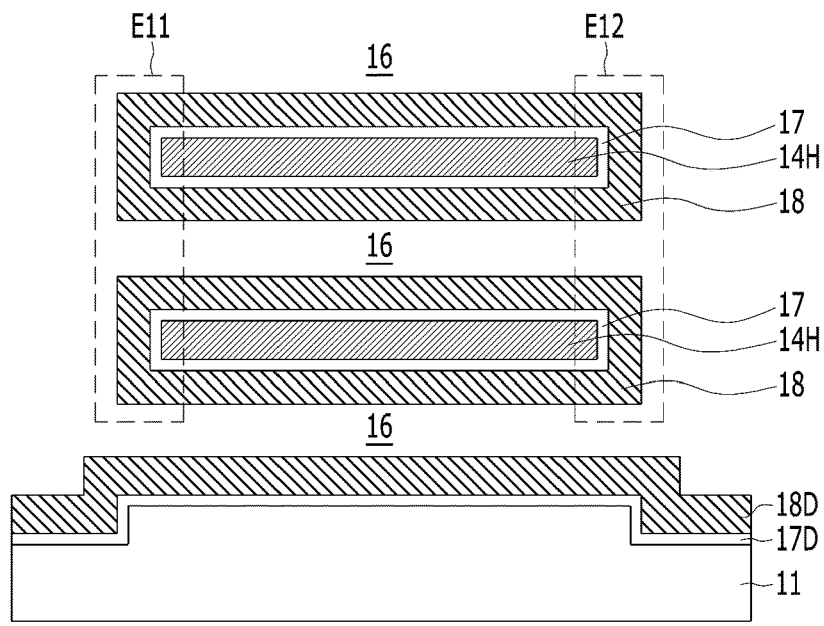

Referring to FIG. 9, a conductive layer 18 may be formed over the gate dielectric layers 17. The conductive layers 18 may include, for example, polysilicon, a metal, a metal nitride, a metal carbide, or combinations thereof. The conductive layers 18 may include tungsten, titanium nitride, doped polysilicon, or a combination thereof. The conductive layer 18 may include a metal-based layer. The conductive layer 18 may be formed, for example, by sequentially depositing materials having different work functions.

The conductive layers 18 may surround corresponding semiconductor layer patterns 14H over the gate dielectric layer 17. Each of the conductive layers 18 may include a first edge portion E11 and a second edge portion E12 that face each other horizontally.

While the conductive layer 18 is formed, a dummy conductive layer 18D may be formed over the first buffer layer 17D. The conductive layer 18 and the dummy conductive layer 18D may be formed of the same material.

Figure 10:
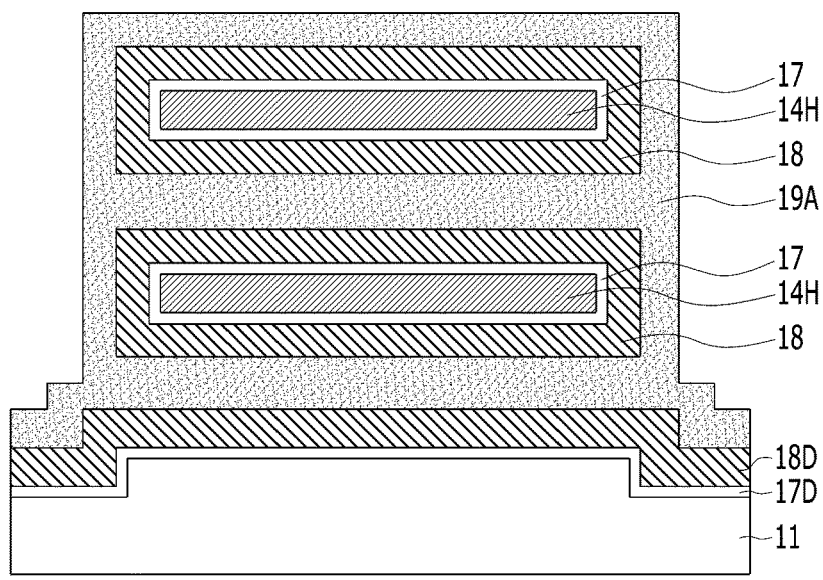

Referring to FIG. 10, a dielectric layer 19A may be formed over the conductive layers 18. The dielectric layer 19A may fill between the conductive layers 18 that are disposed vertically adjacent to each other. The dielectric layer 19A may, for example, include silicon oxide.

Figure 11:
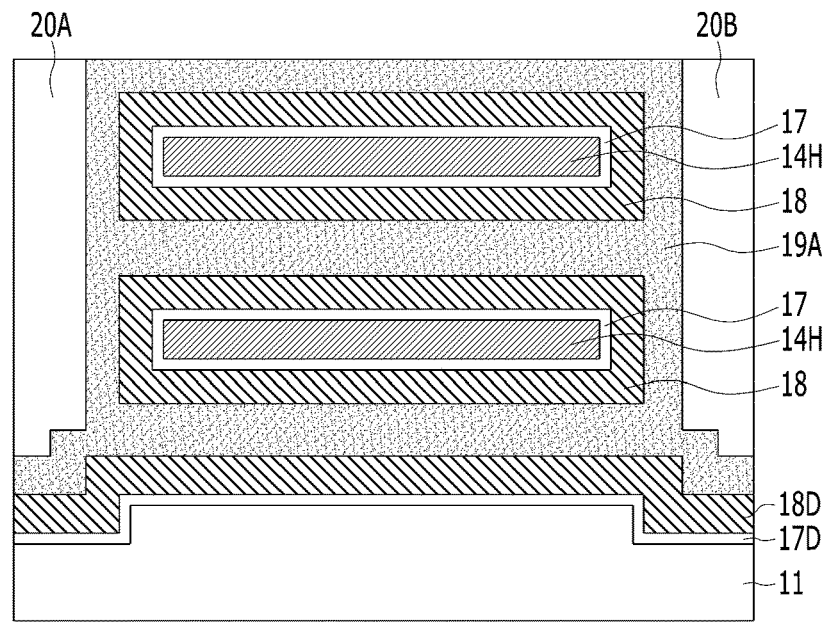

Referring to FIG. 11, sacrificial isolation layers 20A and 20B filling the first openings 15 may be formed. The sacrificial isolation layers 20A and 20B may include a dielectric material, a conductive material, or a combination thereof. The sacrificial isolation layers 20A and 20B may include, for example, silicon oxide, silicon nitride, titanium nitride, amorphous carbon, or a combination thereof. The sacrificial isolation layers 20A and 20B may include a first sacrificial isolation layer 20A and a second sacrificial isolation layer 20B.

Figure 12:
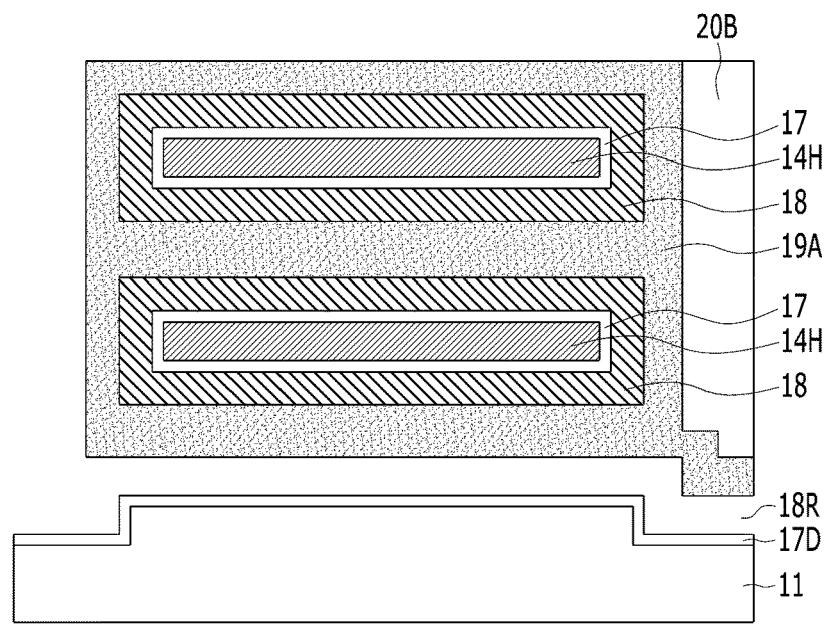

Referring to FIG. 12, one among the sacrificial isolation layers 20A and 20B, e.g., the first sacrificial isolation layer 20A, may be selectively removed. Subsequently, a lower-level gap 18R may be formed by removing the dummy conductive layer 18D. While the dummy conductive layer 18D is removed, the first buffer layer 17D and the dielectric layer 19A may serve as an etch barrier.

Figure 13:
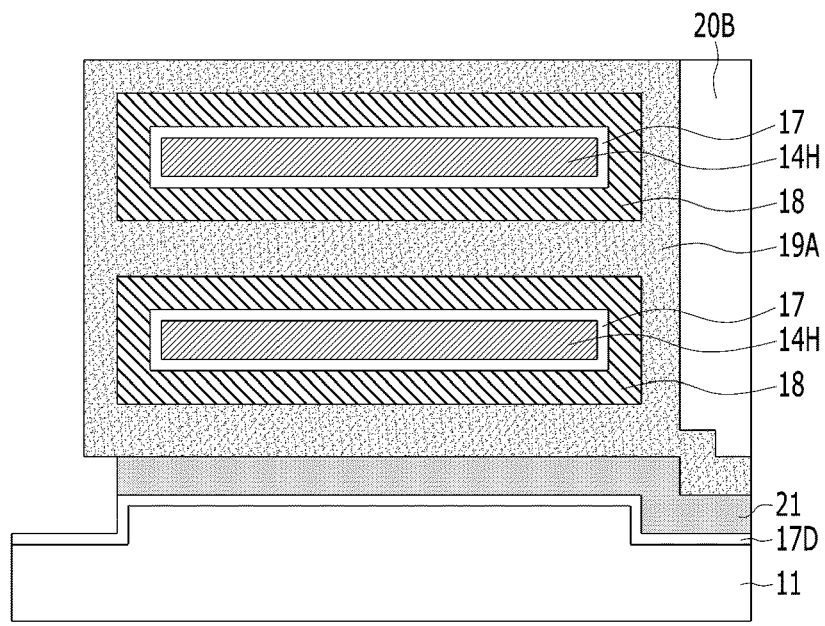

Referring to FIG. 13, a second buffer layer 21 filling the lower-level gap 18R may be formed. The second buffer layer 21 may include, for example, silicon oxide. Forming the second buffer layer 21 may include depositing silicon oxide that fills the lower-level gap 18R and etching the silicon oxide.

Figure 14:
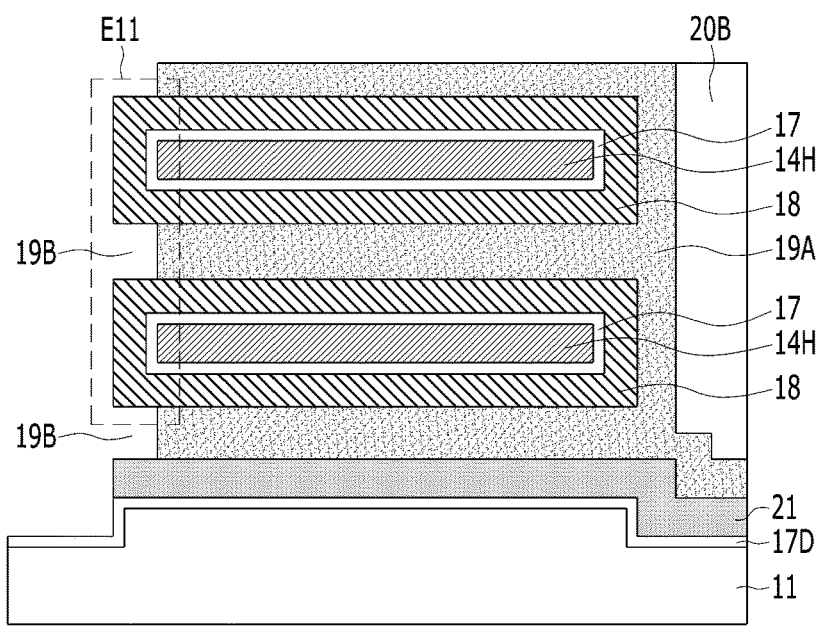

Referring to FIG. 14, the dielectric layer 19A may be selectively cut or etched in order to form cutting portions 19B. Accordingly, the first edge portions E11 of the conductive layer 18 may be exposed by the cutting portions 19B.

Figure 15:
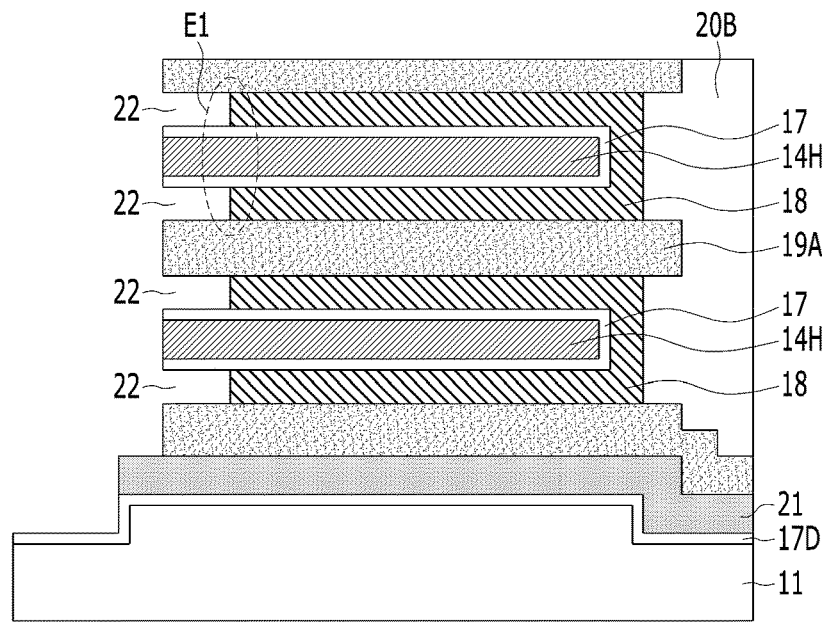

Referring to FIG. 15, the conductive layers 18 may be selectively recessed. As a result, partial recesses 22 may be formed. The partial recesses 22 may expose portions of the gate dielectric layer 17.

The recess process of the conductive layer 18 for forming the partial recesses 22 may be simply referred to as a first recess process of the conductive layer 18.

Figure 16:
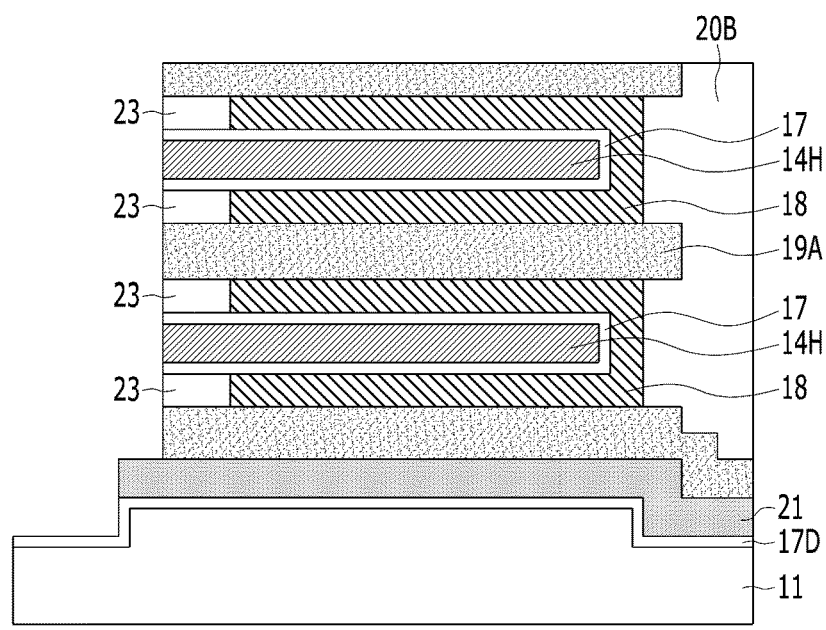

Referring to FIG. 16, a first capping layer 23 filling the partial recesses 22 may be formed. The first capping layer 23 may include, for example, silicon oxide, silicon nitride, or a combination thereof. The first capping layer 23 may be formed by depositing a capping material and performing an etch-back process.

Figure 17:
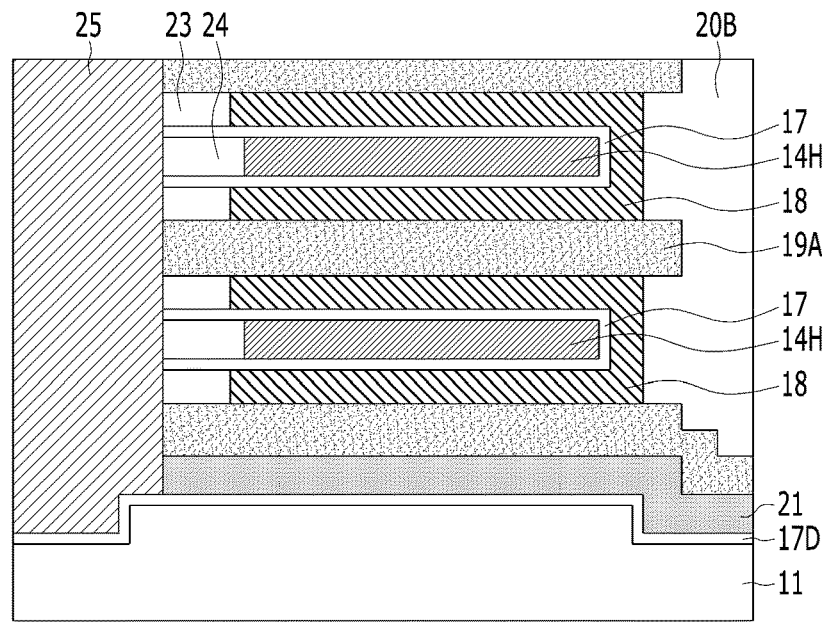

Referring to FIG. 17, a first doped region 24 may be formed on a first side of each of the semiconductor layer patterns 14H. Forming the first doped region 24 may include, for example, depositing polysilicon that is doped with an N-type impurity, performing a heat treatment, and removing the doped polysilicon. The first doped region 24 may include impurities that are diffused from the doped polysilicon. According to another embodiment of the present disclosure, the first doped region 24 may be formed by a process of doping impurities.

Subsequently, a vertical conductive line 25 may be formed. The vertical conductive line 25 may be commonly contacting the first doped regions 24. The vertical conductive line 25 may include, for example, titanium nitride, tungsten, or a combination thereof. The vertical conductive line 25 may include a bit line.

According to another embodiment of the present disclosure, before the vertical conductive line 25 is formed, a first ohmic contact that is in contact with the first side ends of the semiconductor layer patterns 14H may be formed. The first ohmic contact may include, for example, a metal silicide. For example, a metal silicide may be formed by sequentially performing a process of depositing a metal layer and performing an annealing. The unreacted metal layer may be removed. The metal silicide may be formed by reacting silicon of the semiconductor layer pattern 14H with a metal layer.

Figure 18:
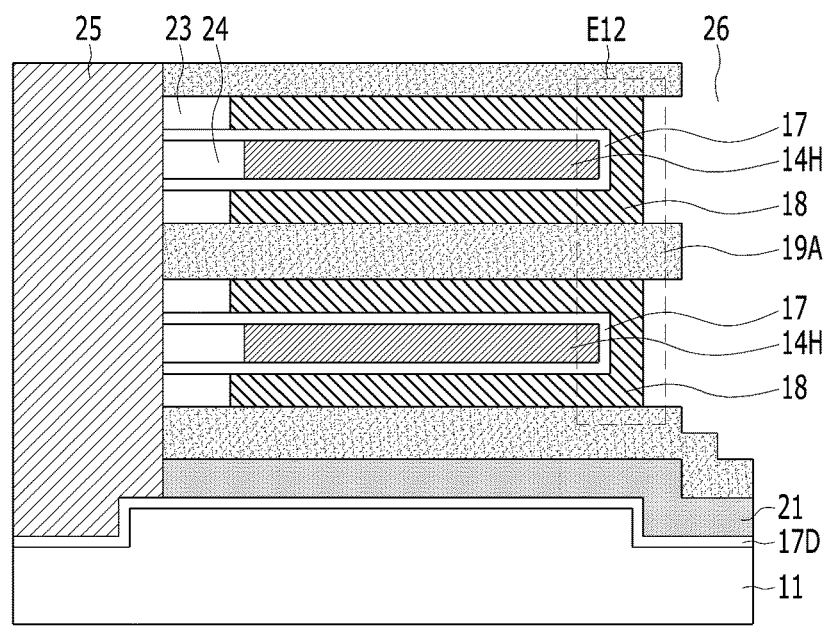

Referring to FIG. 18, second openings 26 may be formed by removing the second sacrificial isolation layer 20B. The second openings 26 may extend vertically from the surface of the lower structure 11.

The second openings 26 may expose the second edge portion E12 of the conductive layers 18.

Figure 19:
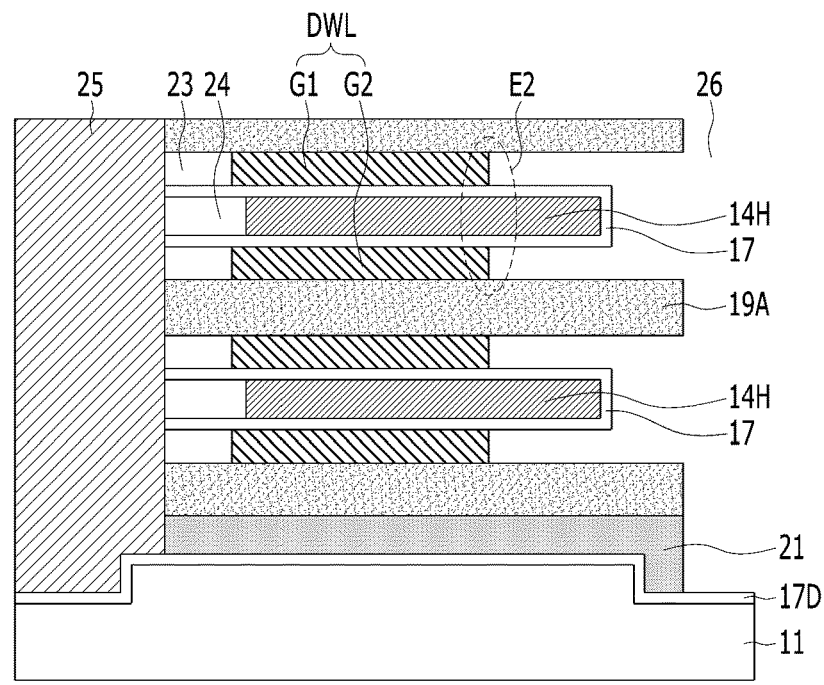

Referring to FIG. 19, the second edge portion E12 of the conductive layer 18s may be selectively recessed through the second opening 26. As a result, the horizontal conductive lines DWL, each including the first horizontal conductive line G1 and the second horizontal conductive line G2 may be formed.

The process of recessing the conductive layer 18 to form the horizontal conductive line DWL may be simply referred to as a second recess process of the conductive layer 18.

As described above, forming the horizontal conductive lines DWL may include forming the gate dielectric layer 17 that covers the surface of the semiconductor layer patterns 14H, forming the conductive layers 18 that surround the semiconductor layer patterns 14H over the gate dielectric layers 17, and performing the first recess process and the second recess process over the conductive layers 18. A first edge portion (refer to 'E1' in FIG. 15) of each of the horizontal conductive lines DWL may be defined by the first recess process, and a second edge portion (refer to 'E2' in FIG. 19) of each of the horizontal conductive lines DWL may be defined by the second recess process.

Since the first and second recess processes are used to form the horizontal conductive lines DWL, gate oxide integrity (GOI) characteristics of the gate dielectric layer 17 may be improved. Also, the thickness of the gate dielectric layer 17 may be maintained uniformly.

According to another embodiment of the present disclosure, the first and second horizontal conductive lines G1 and G2 of the horizontal conductive lines DWL may have a triple work function electrode structure. As a result, it may be possible to improve Gate Induced Drain Leakage (GIDL).

Figure 20:
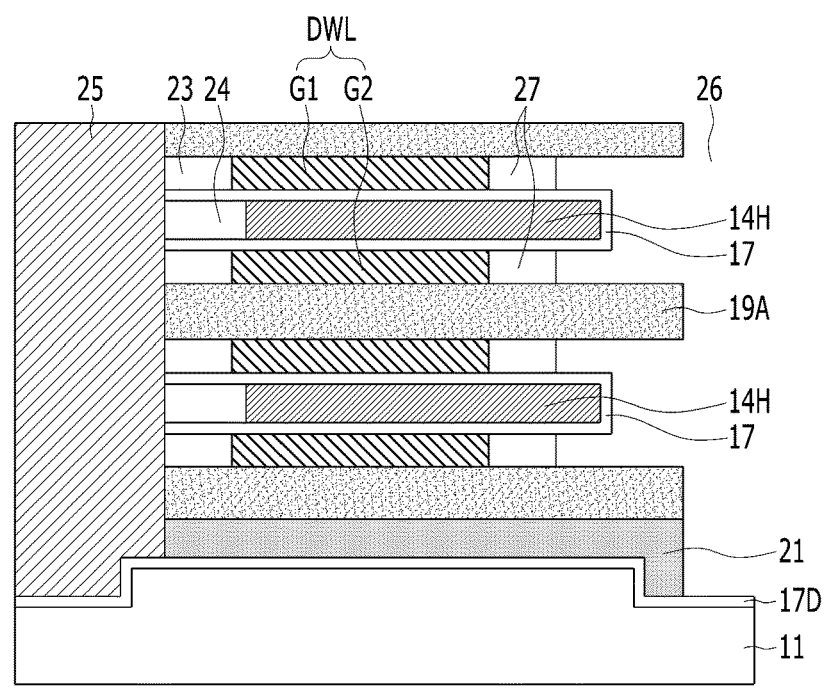

Referring to FIG. 20, second capping layers 27 contacting the first horizontal conductive line G1 and the second horizontal conductive line G2 may be formed. The second capping layer 27 may include, for example, silicon oxide, silicon nitride, or a combination thereof. The second capping layers 27 may be formed by depositing a capping material and performing an etch-back process.

Figure 21:
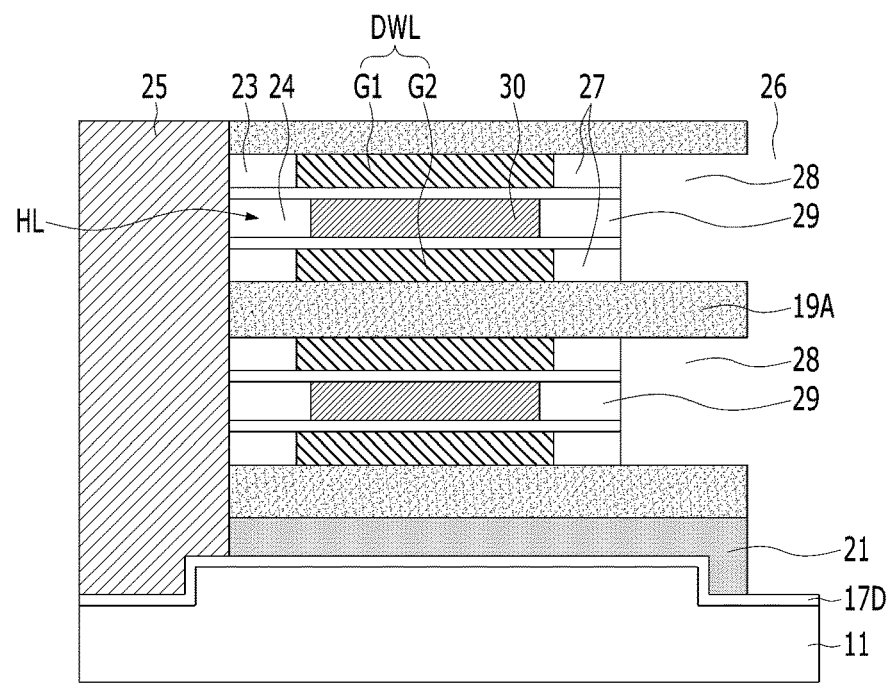

Referring to FIG. 21, the gate dielectric layers 17 and the semiconductor layer patterns 14H may be selectively cut or etched. As a result, wide openings 28 may be formed. The semiconductor layer patterns 14H may remain as the horizontal layer(s) as indicated by reference symbol 'HL', and the wide openings 28 may expose the second side end of the horizontal layer HL.

The wide openings 28 may be disposed between the dielectric layers 19A.

Subsequently, a second doped region 29 may be formed in each of the horizontal layers HL. Forming the second doped region 29 may include, for example, depositing polysilicon that is doped with an N-type impurity, performing a heat treatment, and removing the doped polysilicon. The second doped region 29 may include impurities that are diffused from doped polysilicon. According to another embodiment of the present disclosure, doped polysilicon may remain after the heat treatment. According to another embodiment of the present disclosure, the second doped region 29 may be formed by a process of doping impurities.

According to another embodiment of the present disclosure, a second ohmic contact coupled to corresponding second doped region 29 of the horizontal layer HL may be formed. The second ohmic contact may include a metal silicide. For example, a metal silicide may be formed by sequentially performing deposition of a metal layer and performing annealing, and the unreacted metal layer may be removed. The metal silicide may be formed by reacting the silicon of the horizontal layer HL with the metal layer.

The semiconductor layer patterns 14H may be transformed into horizontal layers HL through the sequence of the processes described above, and each of the horizontal layers HL may include a first doped region 24 and a second doped region 29. Each of the horizontal layers HL may further include a channel CH, and the channel CH may be defined between the first doped region 24 and the second doped region 29. The channel CH may overlap with the horizontal conductive line DWL.

Figure 22:
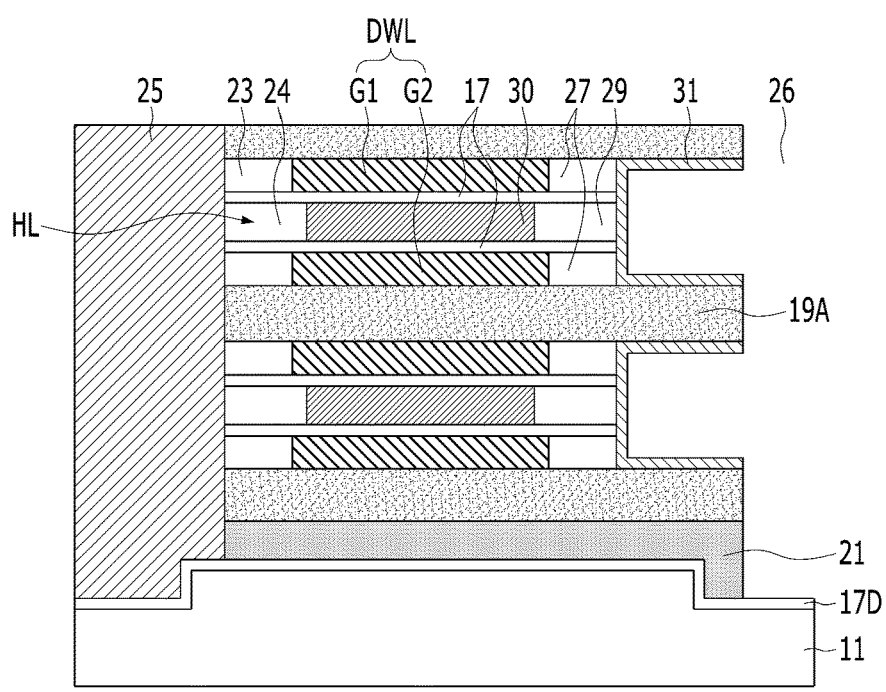

Referring to FIG. 22, a first electrode 31 of the data storage element may be formed to contact the second side ends of the horizontal layers HL. The first electrode 31 may be formed by depositing a conductive material and performing an etch-back process. The first electrode 31 may include, for example, titanium nitride. The first electrode 31 may have a horizontally oriented cylindrical shape.

Figure 23:
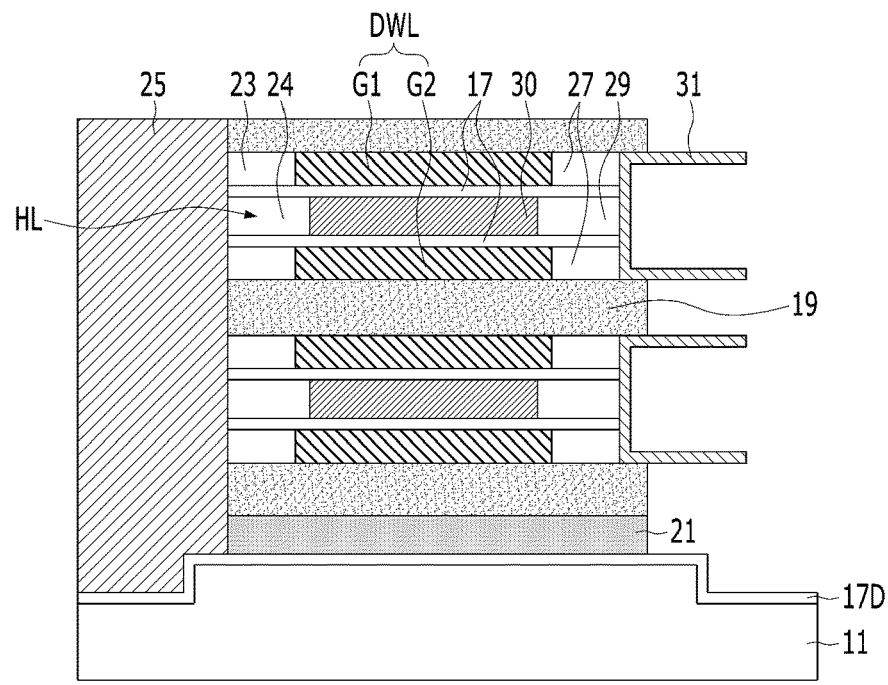

Referring to FIG. 23, the dielectric layers 19A may be partially recessed. As a result, the outer walls of the first electrodes 31 may be exposed. The remaining dielectric layers 19 may contact the horizontal conductive line DWL. The remaining dielectric layers 19 may be referred to as cell isolation layers.

Figure 24:
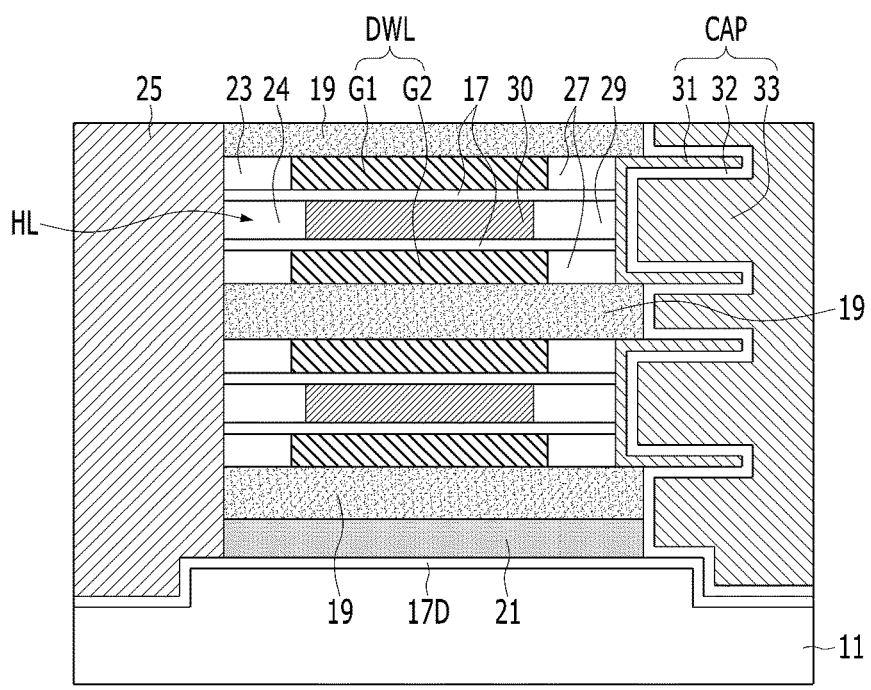

Referring to FIG. 24, a dielectric layer 32 and a second electrode 33 may be sequentially formed over the first electrodes 31. The first electrode 31, the dielectric layer 32 and the second electrode 33 may form a data storage element CAP.

According to FIGS. 4 to 24, since the gate dielectric layer 17 uniformly covers the surface of the semiconductor layer patterns 14H, cell gate oxide integrity (GOI) characteristics may be improved.

Also, since the horizontal conductive line DWL is formed by the recess processes of the conductive layer 18, fume of the conductive layer 18 may be suppressed, thereby improving the yield of forming the horizontal conductive line DWL.

According to embodiments of the present disclosure, as the gate dielectric layer and the word line are directly formed on the upper and lower surfaces of the horizontal layer when three-dimensional memory cells are formed, Cell Gate Oxide Integrity (CGOI), Gate Induced Drain Leakage (GIDL), and word line sheet resistance (WL Rs) and the like may be improved.

According to embodiments of the present disclosure, since a direct-deposition method is applied instead of a replacement process during a process for forming a word line, fume phenomenon may be prevented.

According to embodiments of the present disclosure, 3D memory cells with low power consumption and high integration may be realized.

While the present disclosure has been described with respect to specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a semiconductor layer pattern over a lower structure;
    forming a gate dielectric layer to cover surfaces of the semiconductor layer pattern;
    forming a conductive layer over the gate dielectric layer to surround the semiconductor layer pattern, the conductive layer including a first edge portion and a second edge portion that are facing each other; and
    forming a pair of horizontal conductive lines vertically overlapping the semiconductor pattern by horizontally recessing the first edge portion and the second edge portion of the conductive layer.

2. The method of claim 1, wherein the forming of the semiconductor layer pattern includes:
    sequentially forming, over the lower structure, a first sacrificial layer structure, a semiconductor layer, and a second sacrificial layer structure to form a stack body;
    forming a first opening in the stack body;
    removing the first sacrificial layer structure and the second sacrificial layer structure through the first opening; and
    recessing the semiconductor layer to form the semiconductor layer pattern.

3. The method of claim 2,
    wherein each of the first and second sacrificial layer structures includes a stack of a first silicon germanium layer, a first monocrystalline silicon layer, and a second silicon germanium layer, and
    wherein the semiconductor layer includes a second monocrystalline silicon layer which is thicker than the first monocrystalline silicon layer.

4. The method of claim 1, wherein each of the upper and lower surfaces of the semiconductor layer pattern includes a flat surface.

5. The method of claim 1, wherein the gate dielectric layer fully covers the upper and lower surfaces of the semiconductor layer pattern.

6. The method of claim 1, wherein forming of the gate dielectric layer includes:
    performing a silicon oxide deposition process, or
    performing a surface oxidation process on the semiconductor layer pattern.

7. The method of claim 1, further comprising:
    forming a vertical conductive line that is coupled to a first side of the semiconductor layer pattern; and
    forming a data storage element that is coupled to a second side of the semiconductor layer pattern.

8. The method of claim 1, wherein the semiconductor layer pattern includes a monocrystalline silicon layer.

9. The method of claim 1, wherein the conductive layer includes polysilicon, a metal, a metal nitride, or a combination thereof.

10. The method of claim 1, wherein the forming of the conductive layer includes forming, over the gate dielectric layer, a metal-based layer that surrounds the semiconductor layer pattern.

11. The method of claim 1, wherein the forming of the pair of horizontal conductive lines includes:
    forming, over the gate dielectric layer, a pair of first gates that are respectively disposed over the upper and lower surfaces of the semiconductor layer pattern;
    forming a pair of second gates on first sides of the pair of first gates; and
    forming a pair of third gates on second sides of the pair of first gates.

12. The method of claim 11,
    wherein the second and third gates include a low work function material, and
    wherein the pair of first gates include a high work function material.

13. The method of claim 11,
    wherein the second and third gates include N-doped polysilicon, and
    wherein the pair of first gates include tungsten.

14. The method of claim 11, further comprising:
    forming a first barrier layer between the first gate and the second gate; and
    forming a second barrier layer between the first gate and the third gate.

15. The method of claim 14, wherein the first and second barrier layers include a metal nitride.

\* \* \* \* \*